United States Patent
Rushansky et al.

(10) Patent No.: US 6,349,908 B1
(45) Date of Patent: Feb. 26, 2002

(54) STANDOFF ASSEMBLY AND METHOD FOR SUPPORTING AN ELECTRICAL COMPONENT

(75) Inventors: Yuliy Rushansky, Port Washington; Howard S. Leopold, Melville, both of NY (US)

(73) Assignee: Eagle Electric Manufacturing Co., Inc., Long Island City, NY (US)

( * ) Notice: Subject to any disclaimer, the term of this patent is extended or adjusted under 35 U.S.C. 154(b) by 0 days.

(21) Appl. No.: 09/251,426

(22) Filed: Feb. 17, 1999

(51) Int. Cl.[7] ............................................. F16M 11/00
(52) U.S. Cl. ................................. 248/200; 248/694
(58) Field of Search .......................... 248/200, 201, 248/205.1, 220.21, 694; 361/742, 700, 776, 772, 773, 775, 807, 808; 174/138 G, 221.11, 222.11, 222.12, 74.4, 68.1

(56) References Cited

U.S. PATENT DOCUMENTS

| | | | |
|---|---|---|---|
| 4,254,301 A | * 3/1981 | Serino | 174/138 G |
| 4,962,442 A | * 10/1990 | Clemens | 361/403 |
| 5,708,325 A | * 1/1998 | Anderson et al. | 313/495 |
| 5,887,836 A | * 3/1999 | Back | 248/221.11 |
| 5,894,193 A | * 4/1999 | Amrine et al. | 313/495 |
| 6,008,991 A | * 12/1999 | Hawthorone et al. | 361/770 |
| 6,038,140 A | * 3/2000 | Petri | 361/804 |

OTHER PUBLICATIONS

Bivar Catalog, "Led Mounts", 1996, pp. 28–35.
Bivar Catalog, "Led Mounting Products", 1998, pp. 32–40.

* cited by examiner

Primary Examiner—Ramon O. Ramirez
(74) Attorney, Agent, or Firm—Morgan, Lewis & Bockius LLP

(57) ABSTRACT

A standoff assembly is disclosed for supporting an electrical component including at least one lead. The standoff assembly comprises a first supporting member including a protrusion and defining an opening and a second supporting member including a protrusion to mate with the opening of the first supporting member. The second supporting member defines an opening to receive the protrusion of the first supporting member and the protrusions engage one another to assemble the first and second supporting members.

24 Claims, 7 Drawing Sheets

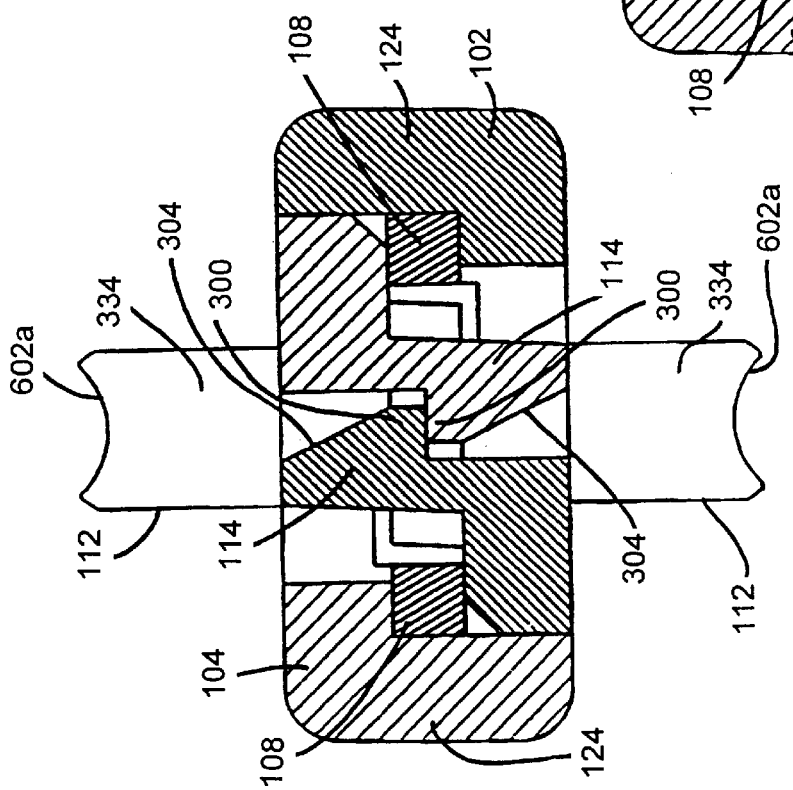

STANDOFF ASSEMBLY AND METHOD FOR SUPPORTING AN ELECTRICAL COMPONENT

RELATED APPLICATION

This application is related to another patent application which is commonly owned by the assignee of this application and which is incorporated by reference. The related application is: application Ser. No. 09/251,427 by inventors Howard S. Leopold and Yuliy Rushansky, entitled ELECTRICAL CIRCUIT INTERRUPTER, filed Feb. 17, 1999.

BACKGROUND OF THE INVENTION

1. Field of Invention

The present invention relates to an improved mounting device, and more particularly, to a standoff assembly for supporting an electrical component.

2. Description of Related Art

In many respects, circuit boards are difficult to manufacture and assemble. For example, the available space to mount elements to a circuit board is limited. Also, the use of small parts makes assembly more difficult. The modern trend is to reduce the size of electrical elements and their associated elements. Accordingly, electrical devices in general require compact elements that can perform their functions effectively.

Standoff assemblies may be used to support electrical components in any number of electrical devices. Conventional standoff assemblies suffer from several shortcomings. These standoff assemblies are bulky and difficult to assemble and mount to a circuit board. Accordingly, a need exists for an improved standoff assembly that is easy to manufacture, assemble, and use. Also, a need exists for a compact standoff assembly that supports an electrical component.

SUMMARY OF THE INVENTION

Accordingly, the present invention is directed to a mounting device, and more particularly, a standoff assembly for supporting an electrical component, that substantially eliminates one or more of the problems due to limitations of the related art.

An object of the invention is to provide a standoff assembly that is easily and economically manufactured.

Another object of the invention is to provide a standoff assembly that is easy to assemble.

Another object of the invention is to provide a standoff assembly that utilizes identical parts to simplify the manufacturing and use of the assembly.

Another object of the invention is to provide a standoff assembly that is easy to mount to a mounting structure such as a circuit board.

A further object of the invention is to provide a compact standoff assembly.

Additional features and advantages of the invention will be set forth in the following detailed description or may be learned by practicing the invention. The objectives and other advantages of the invention will be realized and attained by the structure particularly pointed out in the written description and claims as well as the appended drawings.

To achieve these and other advantages and in accordance with the purpose of the present invention, as embodied and broadly described, the invention includes a standoff assembly for supporting an electrical component including at least one lead, the standoff assembly comprising a first supporting member including a protrusion and defining an opening; and a second supporting member including a protrusion to mate with the opening of the first supporting member and defining an opening to receive the protrusion of the first supporting member, wherein the protrusions engage one another to assemble the first and second supporting members.

Another aspect of the invention includes in combination, a mounting structure and a standoff assembly for supporting an electrical component including at least one lead, the standoff assembly comprising a first supporting member including a protrusion and defining an opening; and a second supporting member including a protrusion to mate with the opening of the first supporting member and defining an opening to receive the protrusion of the first supporting member, wherein the protrusions engage one another to assemble the first and second supporting members.

A further aspect of the present invention includes a method of assembling components for supporting an electrical component including at least one lead, the method comprising the steps of providing a first supporting member including a protrusion and defining an opening; providing a second supporting member including a protrusion to mate with the opening of the first supporting member and defining an opening to receive the protrusion of the first supporting member; positioning the electrical component adjacent to at least one of the first and second supporting members; and engaging the protrusion on the first and second supporting members together to assemble the first and second supporting members.

It is to be understood that both the general description above, and the following detailed description are exemplary and explanatory and are intended to provide further explanation of the invention as claimed.

BRIEF DESCRIPTION OF THE DRAWINGS

The accompanying drawings which are included to provide a further understanding of the invention and constitute a part of this specification, illustrate an embodiment of the invention and together with the written description, serve to explain the principles of the invention. In the drawings:

FIGS. 7A and 7B are cross-sectional views of the supporting members when assembled as taken along lines "7A—7A" and "7B—7B" in FIG. 2, respectively.

DESCRIPTION OF THE PREFERRED EMBODIMENTS

Reference will now be made in detail to the preferred embodiments of the present invention, examples of which are illustrated in the accompanying drawings.

Figure 1:
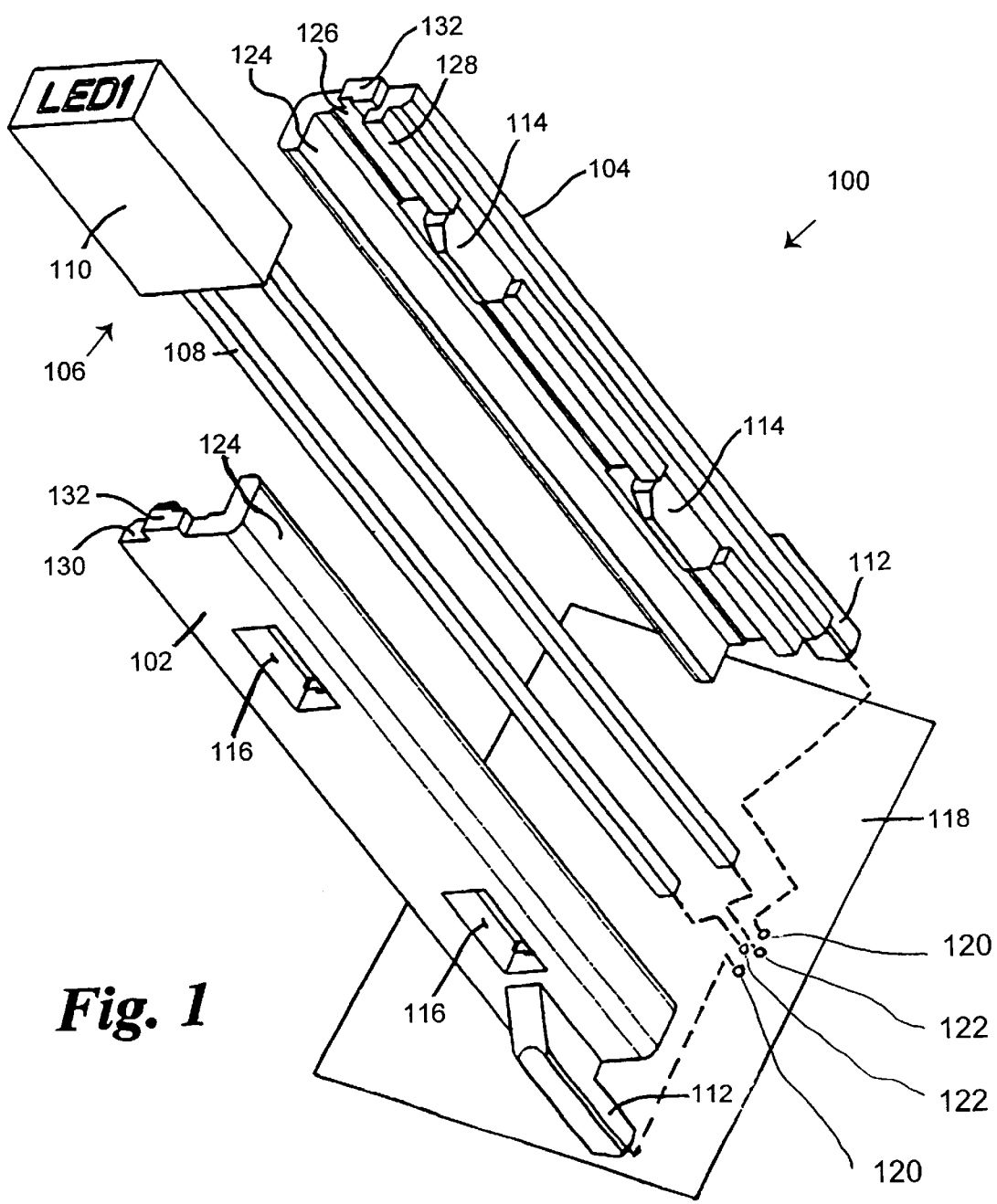
FIG. 1 is an exploded isometric view of the standoff assembly and electrical component.
Figure 2:
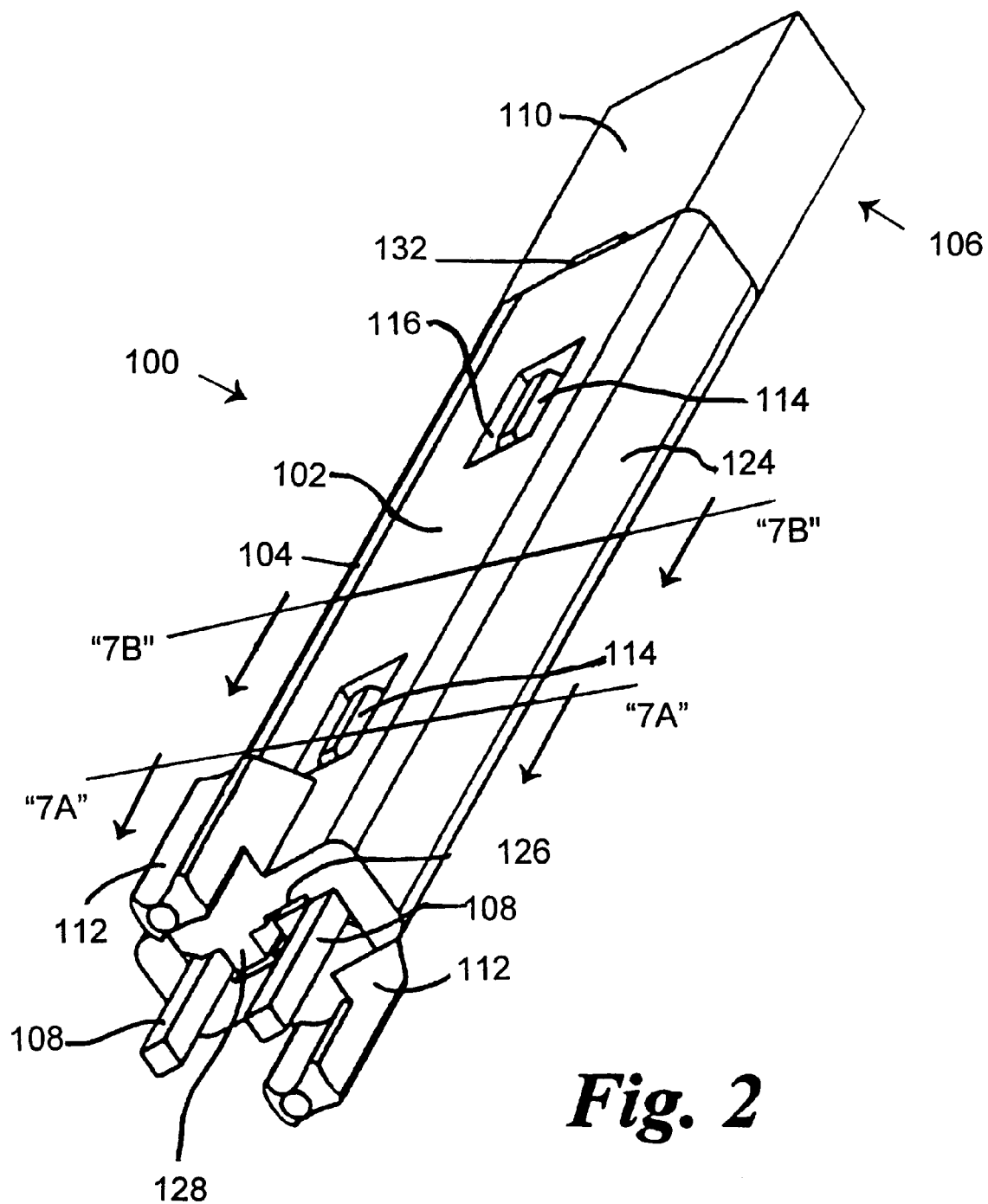
FIG. 2 is an assembled isometric view of the standoff assembly and electrical component.

A standoff assembly and an electrical component according to the present invention are shown in FIGS. 1 and 2. FIG.

1 shows a standoff assembly 100, an electrical component 106, and mounting structure 118 in a disassembled relationship. (Note that the mounting structure 118 is not drawn to its corresponding size relative to the standoff assembly 100.) In an electrical device, the standoff assembly 100 and the electrical component 106 are mounted to mounting structure 118. Mounting structure 118 preferably comprises a circuit board, but may be any structure that can support standoff assembly 100 and electrical component 106.

In the preferred embodiment, the standoff assembly 100 includes a first supporting member 102 and a second supporting member 104. First and second supporting members 102, 104 may be identically shaped and easily connected together. FIG. 2 shows the supporting members 102, 104 connected to form the standoff assembly 100. After the supporting members 102, 104 are connected, they and the electrical component 106 are mounted to the circuit board 118.

According to the invention, the standoff assembly 100 may support numerous types of electrical components. The preferred embodiment of the electrical component 106 is a light emitting diode (LED) 110 with at least one lead 108 that maybe used in a ground fault interrupter (not shown). Each lead 108 of the electrical component 106 is connected to the LED 110 and eventually the circuit board 118.

Since the first and second supporting members 102 and 104 are preferably identical, the following description of the invention uses the same reference numbers for corresponding parts on the supporting members. Also, only first supporting member 102 will be described in detail for simplicity.

According to the invention, the standoff assembly 100 is easy to assemble and to mount to circuit board 118. Supporting member 102 includes a protrusion 114 to facilitate the assembly with supporting member 104. Protrusion 114 is designed to engage with a corresponding protrusion 114 on supporting member 104. Preferably, supporting member 102 includes two protrusions 114 as shown in FIG. 1.

Supporting member 102 includes an opening 116. Opening 116 provides clearance for the top portion of protrusion 114 on supporting member 104 when the supporting members are connected as shown in FIG. 2. The clearance reduces the required size of the standoff assembly 100 by allowing the supporting members 102, 104 to be mounted closer together.

In order to mount the standoff assembly 100 to circuit board 118, supporting member 102 includes an extension 112. When the standoff assembly 100 is mounted to the circuit board 118, the extension 112 of each supporting member 102, 104 is inserted into a hole 120, and leads 108 are inserted into openings 122. The specific details of extension 112 will be discussed in further detail later.

Returning to FIG. 1, the electrical component 106 and supporting members 102, 104 are shown prior to assembly. According to the preferred embodiment, the leads 108 of the electrical component 106 extend between the supporting members 102, 104 of the standoff assembly 100. Accordingly, supporting member 102 includes a flange 124 on one side thereof used to define a space or channel through which leads 108 of the electrical component 106 are positioned. It is noted, however, that a lead of the electrical component 106 could be located either between or outside of the supporting members 102, 104 when they are connected.

In the preferred embodiment, if two or more leads 108 are provided on the electrical component 106, they should be appropriately separated and insulated from each other to avoid shorting. Supporting member 102 also includes a shoulder 128 and a groove 126. The shoulder 128 on the first supporting member 102 engages the groove 126 on the second supporting member 104 when the supporting members 102, 104 are connected. Likewise, the shoulder 128 on the second supporting member 104 engages the groove 126 on the first supporting member 102. The shoulders 128 divide the channel between the supporting members 102, 104 into smaller passages through which a single lead 108 is located. The shoulder 128 and groove 126 will be discussed in detail later. Preferably, supporting member 102 includes a top surface 130 having a tab 132 extending therefrom. Tab 132 facilitates the positioning of the light 110 when the electrical component 106 is supported.

Figures 3A, 3B:
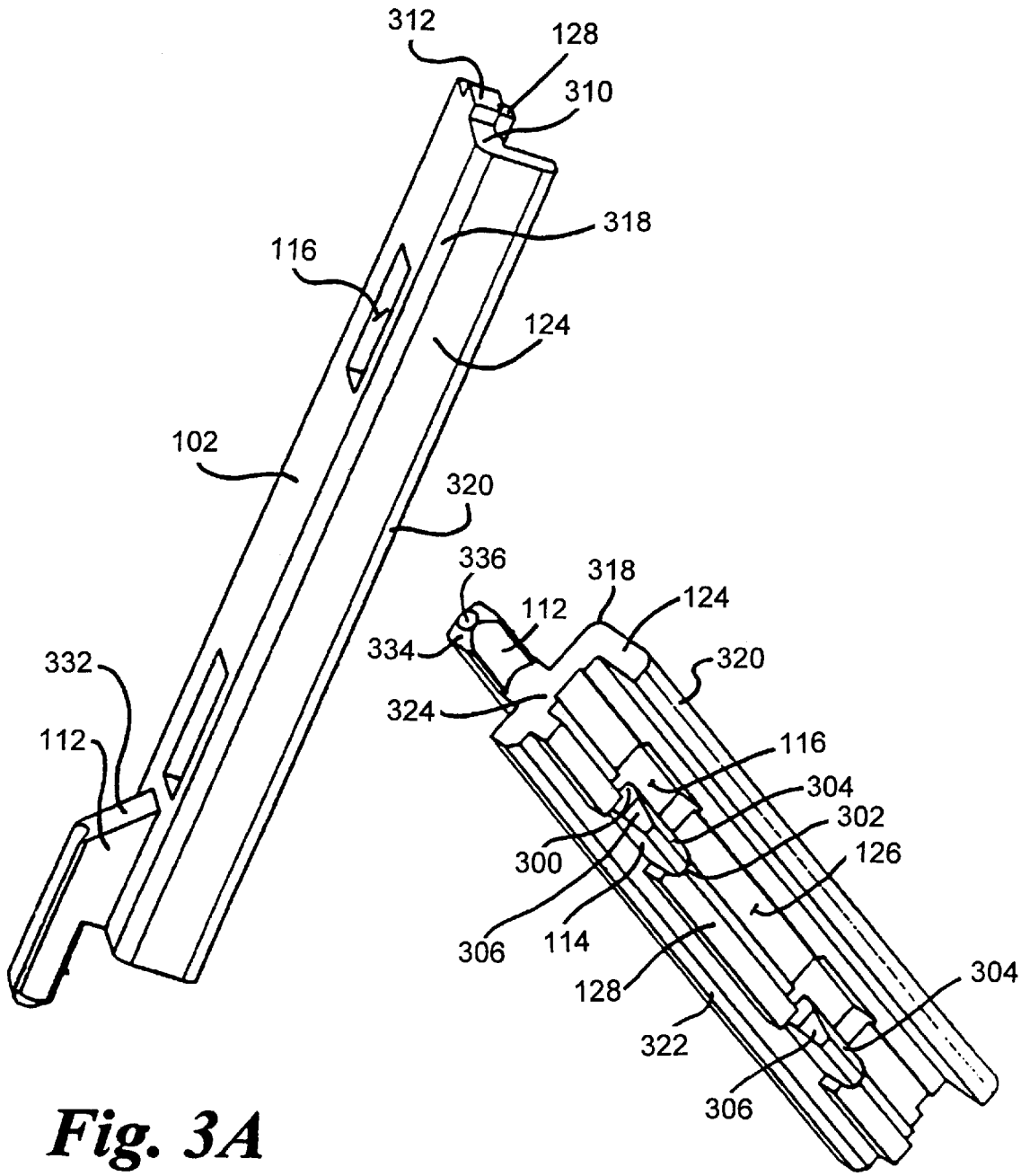
FIGS. 3A and 3B are isometric views of a supporting member.

Turning to FIGS. 3A and 3B, the preferred embodiment of the supporting member 102 is shown. Flange 124 on supporting member 102 has curved edges 318, 320 extending along its length on different sides. The curved edges 318, 320 reduce the overall cross-sectional area of the supporting member 102 and the standoff assembly 100. As shown in FIG. 3A, the supporting member 102 includes an angled edge 322 along a side. The curved edges 318, 320 and angled edge 322 serve to facilitate the assembly and use of the supporting members 102, 104.

Figure 4:
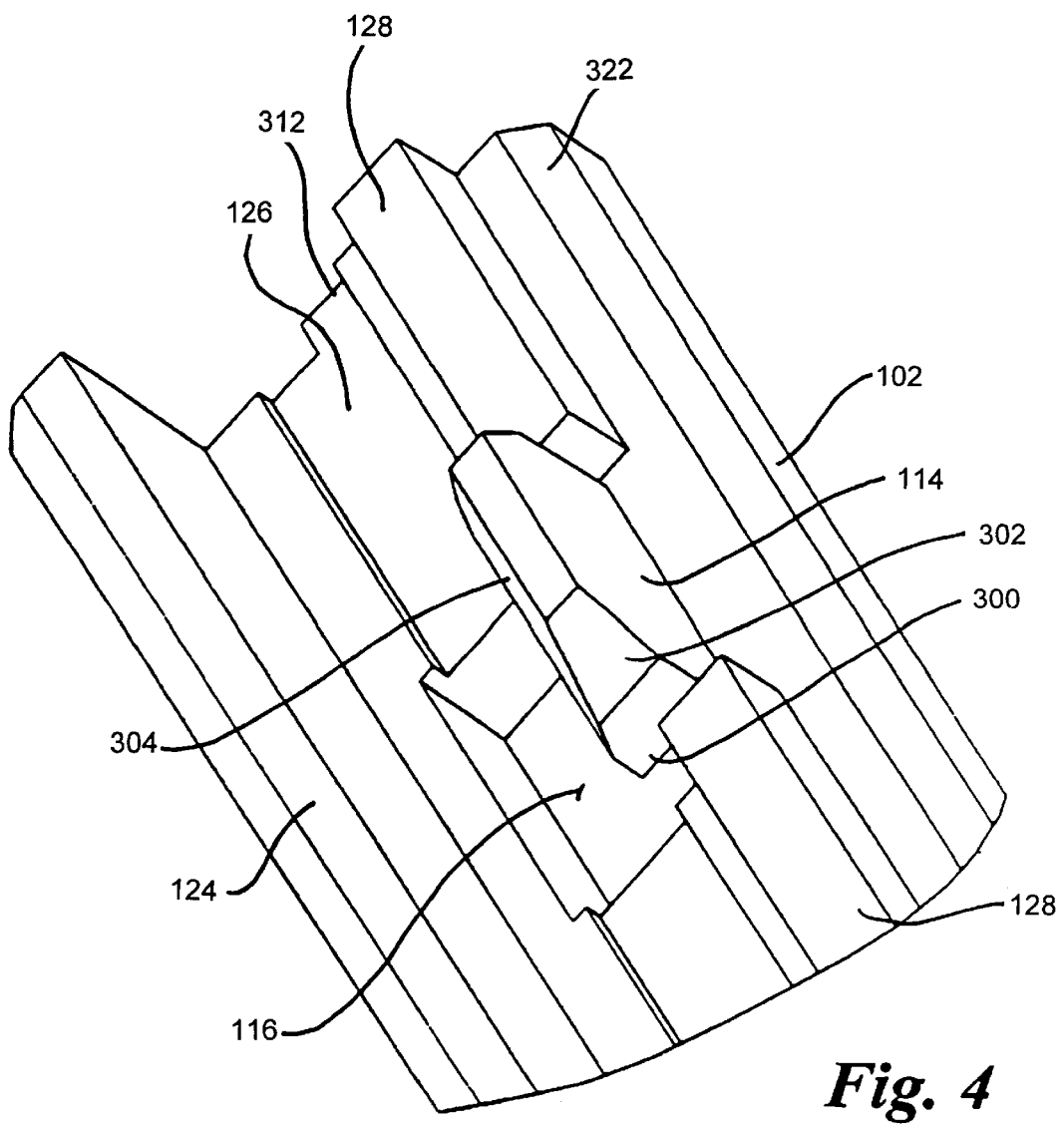
FIG. 4 is an enlarged isometric view of the protrusion of a supporting member.

As discussed previously, the preferred supporting member 102 includes a protrusion 114. Protrusion 114 has a ridge 300 and angled surfaces 302, 304, and 306. FIG. 4 shows an isometric view of protrusion 114 in greater detail. Angled surface 304 on each protrusion 114 facilitates the assembly of the supporting members 102, 104. As the supporting members 102, 104 are connected, the angled surface 304 on each protrusion 114 are slid along the corresponding angled surface 304 until each ridge 300 clears an angled surface 304. At this point, ridge 300 engages with the ridge 300 on the other protrusion 114, thereby securing the supporting members 102, 104 together. It is noted that the shape and number of angled surfaces on each protrusion 114 may be varied so long as the supporting members are securable together.

As shown in FIGS. 3A and 3B, the extension 112 of supporting member 102 is laterally offset from the central longitudinal axis of the supporting member 102. This offset stabilizes the standoff assembly 100 when it is mounted to the circuit board 118. Extension 112 has a top portion with an angled surface 332 and a bottom portion for mounting. In addition to the rounded surfaces and the planar surfaces just discussed, the extension 112 preferably includes a sloped surface 334 that slopes toward the bottom surface 336 and facilitates the insertion of the extension 112 into hole 120.

Figure 5:
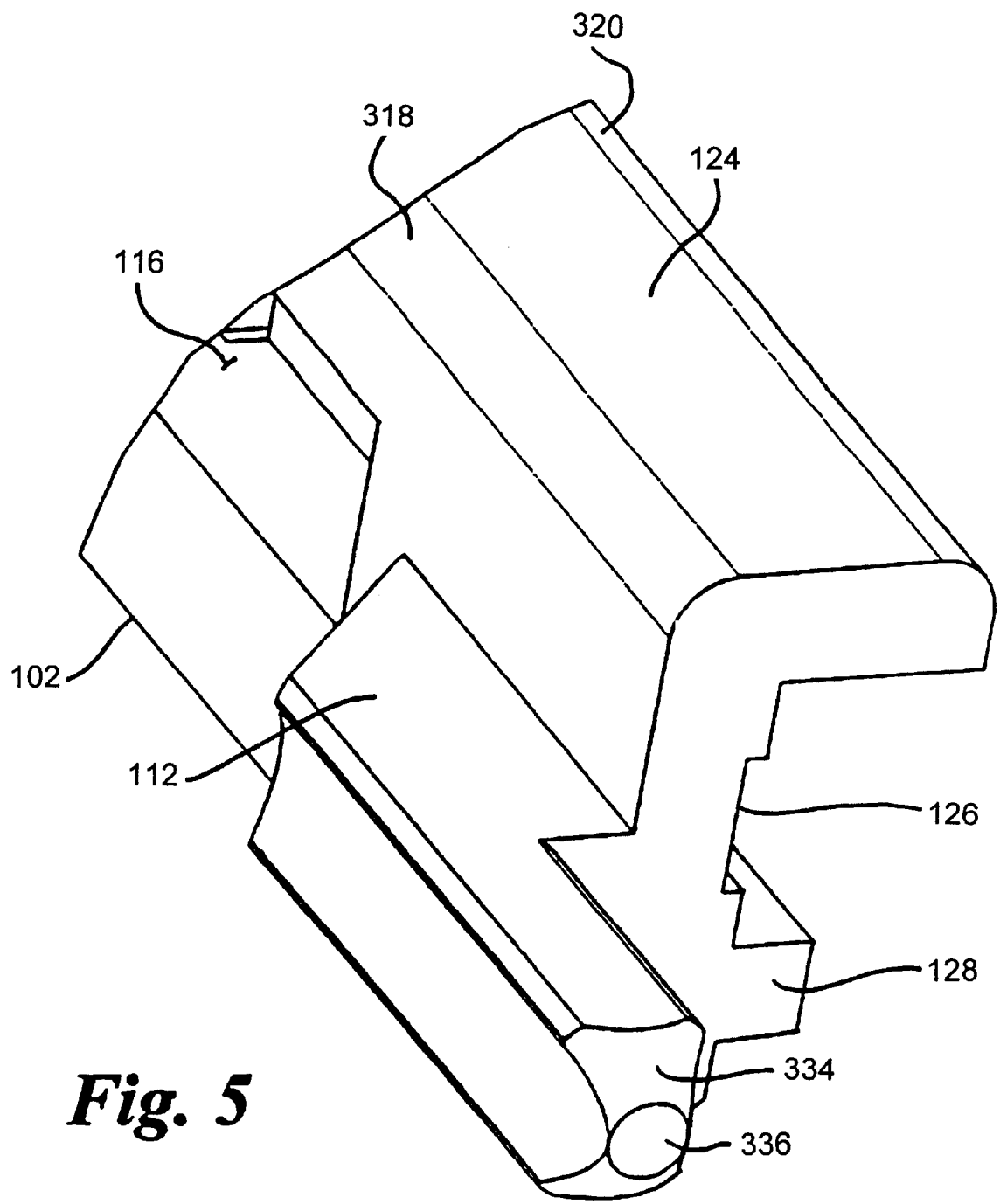
FIG. 5 is an enlarged isometric view of the extension of a supporting member.
Figure 6:
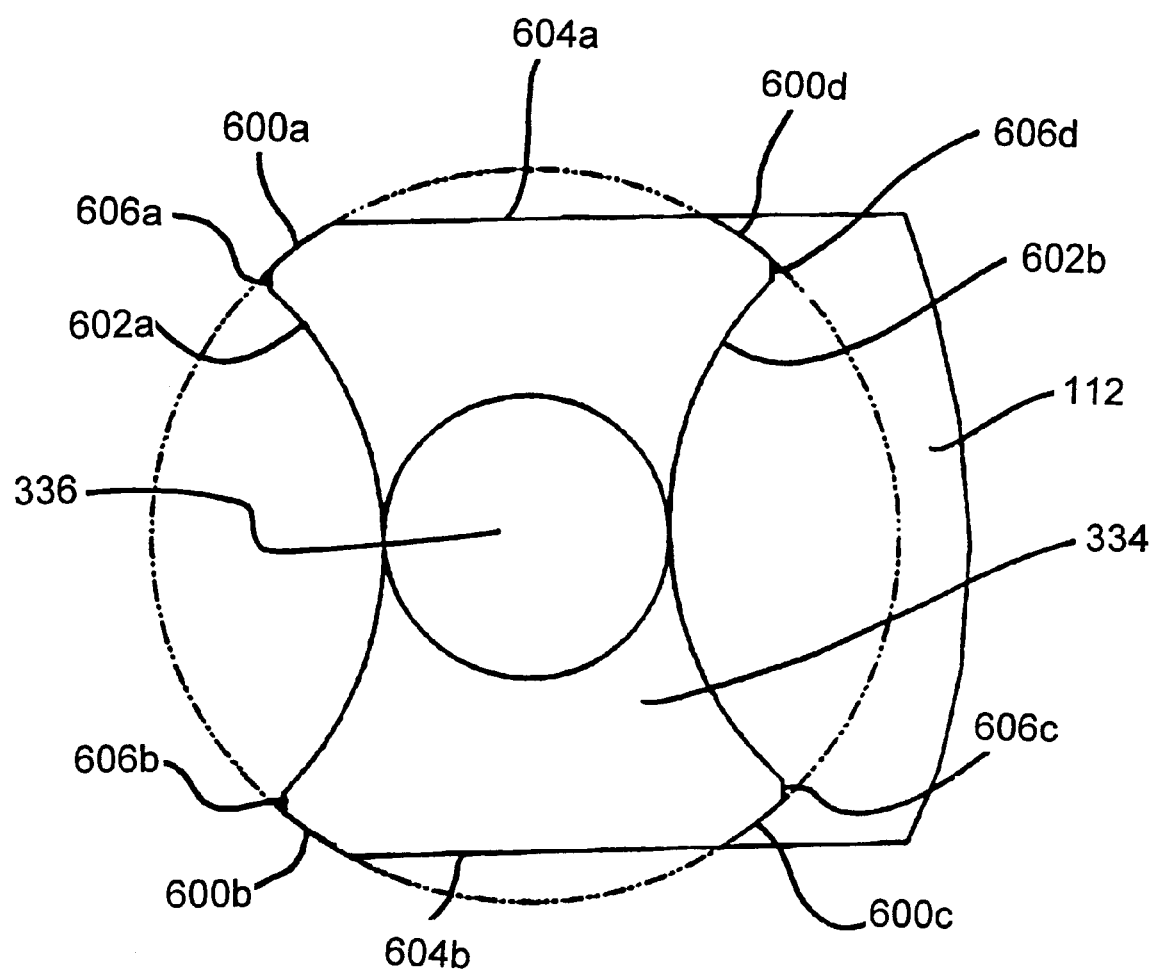
FIG. 6 is a bottom view of the extension of a supporting member.

Referring to FIGS. 5 and 6, the various surfaces of extension 112 are shown in detail. Narrow rounded surfaces 600a, b, c, d are convex shaped and wide rounded surfaces 602a, b are concave shaped as shown in FIG. 6. The dotted lines in FIG. 6 show that a perimeter defined by the radius of curvature of the narrow rounded surfaces 600a, b, c, d, has a cross-sectional shape of a cylinder. Wide rounded surfaces 602a, b are concave surfaces and thus not formed along the dotted line. Surfaces 602a, b are shown as "carved out" of the dotted-line cylinder and have substantially the same radius of curvature as the cylinder, but have a different center point. The midpoint along the wide rounded surfaces 602a, b matches up vertically with the outer perimeter of bottom surface 336 of the extension 112.

The preferred embodiment of the extension 112 includes planar surfaces in addition to the rounded surfaces. Planar surfaces 604a, b and 606a, b, c, d are alternately positioned between the rounded surfaces. While the preferred configuration of the extension uses alternating rounded surfaces and planar surfaces, any combination of different surface shapes may be used on extension 112.

The preferred material of each elongated member is plastic. However, any material that can support an electrical component and provides appropriate insulation may be used.

Referring to FIGS. 7A and 7B, the assembly of the standoff assembly 100 will now be discussed. FIG. 7A is a cross-sectional view through the protrusions 114 of each of the supporting members 102, 104 when they are assembled. FIG. 7A shows the engagement of ridges 300 of each protrusion 114. Ridges 300 secure the supporting members 102, 104 together. In order to disconnect them, the user may push the flanges 124 of each supporting together until the ridges 300 disengage. It is noted that protrusions 114 may be replaced with other securing means that secure the supporting members together.

FIG. 7B is a cross-sectional view of the supporting members 102, 104 above the protrusions 114 after assembly. As discussed previously, the shoulder 128 of each supporting member engages the groove 126 of the other supporting member.

In another aspect, the present invention is directed to a method of assembling a device including supporting an electrical component, FIG. 1 shows the standoff assembly 100, electrical component 106, and circuit board 118 before assembly. Initially, the leads 108 of the electrical component 106 are positioned between the supporting members 102, 104. The supporting members 102, 104 are brought into contact so that each of their protrusions 114 engage the corresponding protrusion 114 on the other supporting member. The operator applies force on the outer surfaces of the supporting members 102, 104 to slide the angled surfaces 304 of the protrusions 114 along one another until the ridges 300 clear the angled surfaces 304. Once the ridges 300 on each protrusion 114 engage with the ridge 300 on the corresponding protrusion 114, the supporting members 102, 104 are secured in place and support the electrical component 106.

Next, the combination of the electrical component 106 and the standoff assembly 100 is connected to the circuit board 118. As discussed previously, extensions 112 of the supporting members 102, 104 are inserted into holes 120 and the ends of leads 108 of the electrical component 106 are inserted into openings 122.

It is to be understood that the number of protrusions on each supporting member and their shape may be varied so long as supporting members may be easily connected together. Also, the number of leads on the electrical component may be varied so long as the supporting members can support the electrical component. Finally, the circuit board or other mounting structure may be provided with any number of holes in any number of orientations to receive the leads of an electrical component and the extensions of the supporting members therein.

It will be apparent to those skilled in the art that various modifications and variations can be made in the support stand of the present invention without departing from the spirit or scope of the invention. Thus, it is intended that the present invention cover the modifications and variations of this invention provided they come within the scope of the appended claims and their equivalents.

We claim:

1. A standoff assembly for supporting an electrical component including at least one lead, the standoff assembly comprising:

a first supporting member including a protrusion and defining an opening; and a second supporting member including a protrusion to mate with the opening of the first supporting member and defining an opening to receive the protrusion of the first supporting member, wherein the protrusions engage one another to assemble the first and second supporting members.

2. The standoff assembly as recited in claim 1, wherein the first supporting member includes an extension for mounting the first supporting member to a mounting structure.

3. The standoff assembly as recited in claim 2, wherein the extension includes a rounded surface along its length.

4. The standoff assembly as recited in claim 2, wherein the extension includes a bottom portion having a sloped surface at one end.

5. The standoff assembly as recited in claim 1, wherein each protrusion includes a ridge and an angled surface, the angled surfaces of the protrusions contacting each other as the first and second supporting members are assembled.

6. The standoff assembly as recited in claim 5, wherein the ridge on each supporting member engages a corresponding ridge on the other supporting member when the supporting members are connected, and wherein the ridges secure the supporting members together.

7. The standoff assembly as recited in claim 1, wherein the first and second supporting members are assembled to form a channel to receive a lead of the electrical component.

8. The standoff assembly as recited in claim 1, wherein each supporting member includes a shoulder and defines a groove, each shoulder mating with the groove of the other supporting member when the supporting members are assembled.

9. The standoff assembly as recited in claim 1, wherein the first supporting member and the second supporting member are substantially identical.

10. The standoff assembly as recited in claim 1, wherein the first supporting member and the second supporting member are configured such that, when assembled, a channel in which the lead can be located is provided along a longest lengthwise direction of the first and second supporting members.

11. In combination, a mounting structure and a standoff assembly for supporting an electrical component including at least one lead, the standoff assembly comprising:

a first supporting member including a protrusion and defining an opening; and a second supporting member including a protrusion to mate with the opening of the first supporting member and defining an opening to receive the protrusion of the first supporting member, wherein the protrusions engage one another to assemble the first and second supporting members.

12. The standoff assembly as recited in claim 11, wherein the first supporting member includes an extension for mounting the first supporting member to the mounting structure.

13. The standoff assembly as recited in claim 12, wherein the extension includes a rounded surface along its length.

14. The standoff assembly as recited in claim 12, wherein the extension includes a bottom portion having a sloped surface at one end.

15. The standoff assembly as recited in claim 11, wherein each protrusion includes a ridge and an angled surface, the angled surfaces of the protrusions contacting each other as the first and second supporting members are assembled.

16. The standoff assembly as recited in claim 15, wherein the ridge on each supporting member engages a corresponding ridge on the other supporting member when the supporting members are connected, and wherein the ridges secure the supporting members together.

17. The standoff assembly as recited in claim 11, wherein the first and second supporting members are assembled to form a channel to receive a lead of the electrical component.

18. The standoff assembly as recited in claim 11, wherein each supporting member includes a shoulder and defines a groove, each shoulder mating with the groove of the other supporting member when the supporting members are assembled.

19. The standoff assembly as recited in claim 11, wherein the first supporting member and the second supporting member are substantially identical.

20. The standoff assembly as recited in claim 11, wherein the first supporting member and the second supporting member are configured such that, when assembled, a channel in which the lead can be located is provided along a longest lengthwise direction of the first and second supporting members.

21. A method of assembling components for supporting an electrical component including at least one lead, the method comprising the steps of:

providing a first supporting member including a protrusion and defining an opening;

providing a second supporting member including a protrusion to mate with the opening of the first supporting member and defining an opening to receive the protrusion of the first supporting member;

positioning the electrical component adjacent to at least one of the first and second supporting members; and engaging the protrusions on the first and second supporting members together to assemble the first and second supporting members.

22. The method of supporting an electrical component as recited in claim 21, wherein the step of engaging the protrusions further comprises the steps of:

providing a ridge on each protrusion; and moving the first and second supporting members together until the ridge on one supporting member engages a corresponding ridge on the other supporting member.

23. The method of supporting an electrical component as recited in claim 21, further comprising the steps of:

providing a mounting structure; and mounting the first and second supporting members and electrical component to the mounting structure.

24. The method of supporting an electrical component as recited in claim 21, wherein the step of mounting the first and second supporting members further comprises the steps of:

defining at least two openings in the mounting structure;

providing an extension on each of the first and second supporting members; and inserting the extensions into the openings of the mounting structure to support the electrical component.

\* \* \* \* \*